(12) United States Patent
MacIntyre

(10) Patent No.: US 7,205,181 B1
(45) Date of Patent: Apr. 17, 2007

(54) METHOD OF FORMING HERMETIC WAFER SCALE INTEGRATED CIRCUIT STRUCTURE

(75) Inventor: Donald M. MacIntyre, San Jose, CA (US)

(73) Assignee: MCSP, LLC, San Jose, CA (US)

( * ) Notice: Subject to any disclaimer, the term of this patent is extended or adjusted under 35 U.S.C. 154(b) by 14 days.

(21) Appl. No.: 11/250,821

(22) Filed: Oct. 14, 2005

Related U.S. Application Data

(60) Division of application No. 10/190,055, filed on Jul. 3, 2002, now Pat. No. 6,982,475, and a continuation-in-part of application No. 09/686,016, filed on Oct. 10, 2000, now Pat. No. 6,555,469, and a continuation-in-part of application No. 09/045,507, filed on Mar. 20, 1998, which is a division of application No. 09/045,507, filed on Mar. 20, 1998.

(51) Int. Cl.
 *H01L 23/15* (2006.01)
(52) U.S. Cl. .............................. 438/126; 257/E23.009
(58) Field of Classification Search ........ 257/E23.009, 257/E23.123, E23.131; 438/110
See application file for complete search history.

(56) References Cited

U.S. PATENT DOCUMENTS

| | | | |
|---|---|---|---|
| 4,356,374 A | 10/1982 | Noyori et al. | 219/121 |
| 5,258,648 A | 11/1993 | Lin | 257/778 |
| 5,705,858 A | 1/1998 | Tsukamoto | 257/778 |
| 5,814,894 A | 9/1998 | Igarashi et al. | 257/787 |
| 5,844,304 A | 12/1998 | Kata et al. | 257/620 |
| 6,149,122 A | 11/2000 | Berger et al. | 249/119 |
| 6,221,751 B1 | 4/2001 | Chen et al. | 438/612 |

(Continued)

Primary Examiner—Carl Whitehead, Jr.
Assistant Examiner—Jennifer M Dolan
(74) Attorney, Agent, or Firm—Stallman & Pollock LLP

(57) ABSTRACT

A wafer scale semiconductor integrated circuit packaging technique provides a hermetic seal for the individual integrated circuit die formed as part of the wafer scale structure. A semiconductor wafer is manufactured to include a number of individual semiconductor die. Each individual die formed on the wafer includes a number of bond pads that are exposed on the die surface in various locations to provide electrical connections to the circuitry created on the die. The wafer further includes a planar glass sheet that is substantially the same size as the wafer, the glass sheet being adhered to the wafer using a suitable adhesive. The glass sheet has a number of pre-formed holes in it, the arrangement of the pre-formed holes corresponding to the location of the bond pads at each of the individual semiconductor die formed as part of the wafer structure. Following adherence of the glass sheet to the semiconductor wafer utilizing the intermediate adhesive material, metal connections are made between pads formed on the glass sheet and the bond pads formed on the integrated circuit die. Solder balls are then attached to the pads on the glass sheet to provide a conductive flow between the solder balls and the bond pads. After the solder balls are attached, trenches are cut around each of the individual die on the wafer. The trenches are cut at an angle and extend through the glass sheet and the intermediate adhesive material and into the semiconductor substrate in which the integrated circuits are formed. After the trenches are cut around each individual semiconductor die, a noble metal is deposited on the sidewalls of the trench to extend over the interface between the glass sheet, the adhesive material and the semiconductor die. The wafer is then cut along the noble metal lined trenches to provide individual, hermetically sealed packaged integrated circuit die.

37 Claims, 5 Drawing Sheets

U.S. PATENT DOCUMENTS

| | | | |
|---|---|---|---|
| 6,300,235 B1 | 10/2001 | Feldner et al. | 438/618 |
| 6,303,977 B1 | 10/2001 | Schroen et al. | 257/635 |
| 6,607,941 B2 | 8/2003 | Prabhu et al. | 438/113 |
| 2002/0100608 A1 | 8/2002 | Fushie et al. | 174/255 |
| 2002/0192939 A1 | 12/2002 | Sugihara | 438/629 |

METHOD OF FORMING HERMETIC WAFER SCALE INTEGRATED CIRCUIT STRUCTURE

RELATED APPLICATIONS

The present application is a divisional of application Ser. No. 10/190,055, filed on Jul. 3, 2002 now U.S. Pat. No. 6,982,475, titled HERMETIC WAFER SCALE INTEGRATED CIRCUIT STRUCTURE, and which is the subject of a Notice of Allowance issued by the U.S. Patent Office on Aug. 4, 2005. Application Ser. No. 10/190,055 is a Continuation-In-Part of co-pending application Ser. No. 09/045,507, filed Mar. 20, 1998, titled CHIP SCALE PACKAGES, and also of application Ser. No. 09/686,016, filed Oct. 10, 2000, titled CHIP SCALE PACKAGES, now U.S. Pat. No. 6,555,469, issued Apr. 29, 2003, which is a divisional of application Ser. No. 09/045,507, filed on Mar. 20, 1998.

BACKGROUND OF THE INVENTION

1. Field of the Invention

The present invention relates generally to the packaging of semiconductor integrated circuit (IC) die and, in particular, to the packaging of semiconductor IC die in chip scale packages at the wafer level structure of the integrated circuit manufacturing process. In one of its aspects, the invention specifically relates to packaging individual semiconductor IC die at the wafer structure level in chip scale packages that are hermetically sealed against moisture and other environmental conditions.

2. Discussion of the Related Art

Chip Scale Packages (CSP) for semiconductor die currently embody some form of solder ball or bump to attach the die to the next higher assembly in the total package. In the simplest form of a CSP, the CSP is a flip-chip semiconductor die that has additional solder bumps to be connected to normal bond pads on, for example, a printed circuit board (PCB) substrate.

The most recent innovations in flip-chip technology involve the relocation of the solder ball/bump sites from the close pitch pads that are normally placed around the perimeter of the semiconductor die to an array located across the surface of the die. This is accomplished by creating new traces from the perimeter locations to the new array locations on top of a passivation layer. The passivation layer is typically a spun-on glass layer formed on the surface of the die; openings are formed in the glass to expose the bond pads or by adding an interposer connector, which is bonded to the existing pads and reroutes traces to the array.

A current interposer connector process reroutes connectors to the pads by extending them into the space between adjacent die as created on the semiconductor wafer, laminating a piece of glass to either side of the wafer and then through a complex series of mechanical cutting, metal deposition and etching operations, the connectors to the pads are extended to the surface of the glass. This produces an array on the top of the glass covering the die, which is in turn adhesively bonded to the passivation surface of the die. The advantage of this process and structure is that the glass provides a protective surface for the delicate surface of the passivated die and allows some degree of differential expansion between the die surface and the array of solder balls due to the non-rigid nature of the adhesive layer. The disadvantages are that the extension of the connectors to the pads on the wafer are difficult to implement and often prevent the process from being possible, the glass cutting operation is costly and requires special equipment, the process is implemented on a completed semiconductor wafer which is very sensitive and costly and any error causes the entire wafer to be scrapped, and two sheets of glass are always required.

Therefore, what is needed is a chip scale flip chip process that is easy to implement, uses one glass sheet and is inexpensive.

SUMMARY OF THE INVENTION

The present invention provides a wafer scale semiconductor integrated circuit packaging technique that provides a hermetic seal for the individual IC chips formed as part of the wafer scale structure.

In accordance with the invention, a semiconductor wafer is manufactured to include a number of individual semiconductor die formed on the wafer. Each individual semiconductor die formed on the wafer includes a number of bond pads that are exposed on the die surface in various different locations to provide electrical connections to the circuitry created on the die. The semiconductor wafer further includes a planar sheet glass that is substantially the same size as the semiconductor wafer adhered to the wafer. The glass sheet has a number of pre-formed holes in it, the arrangement of pre-formed holes corresponding to the location of the bond pads on each of the individual semiconductor die formed as part of the wafer structure.

Prior to being adhered to the semiconductor wafer, the glass sheet has a number of metal pads formed on it. More specifically, a metal pad is created adjacent to each pre-formed hole in the glass sheet. Metal traces are then formed on the glass sheet such that a metal trace leads from each bond pad formed on the glass sheet to the associated pre-formed hole in the glass sheet. After these metal traces and pads have been formed on the glass sheet, the glass sheet is optically aligned with the wafer so that the pre-formed holes in the glass sheet align with the bond pad locations on the wafer substrate. The glass sheet is then adhered to the wafer utilizing a suitable adhesive. After the glass sheet is adhered to the wafer, metal electrical connections are formed between the metal traces and the bond pads on the surface of the glass sheet. After formation of the electrical connections from the bond pads on the semiconductor die to the metallic traces and metallic pads on the surface of the glass sheet, solder balls are formed on the metallic pads. The solder balls will be used to electrically connect the individual packaged semiconductor die to a motherboard or another location to which the semiconductor circuitry is to be electrically connected. After the solder balls are attached, trenches are cut around each individual semiconductor die on the wafer. The trenches are cut at an angle and extend through the glass sheet and the adhesive material and into the semiconductor substrate material in which the integrated circuits are formed. After the trenches are cut around each individual semiconductor, a noble metal is deposited on the sidewalls of the trenches such that the noble metal extends over the interface between the glass sheet, the adhesive material and the semiconductor die. The wafer structure is then cut along the noble metal lined trenches to provide individual, hermetically packed IC die.

That is, the layer of noble metal covering the interface between the sheet of glass, the adhesive material and the semiconductor die, and which extends around the entire perimeter of each IC die formed as part of the wafer structure, creates a hermetic seal that prevents moisture and other environmental elements from reaching the surface of the semiconductor die in the package. Thus, the hermetic seal prevents the sensitive electrical circuitry on the surface of the semiconductor die from being exposed to environmental elements that could damage or destroy those electrical circuits. The hermetically sealed chip scale package of the present invention allows the use of this compact inexpensive packaging methodology in severe environmental conditions.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

The following detailed description presents one method of manufacturing a wafer scale structure of hermetically sealed semiconductor integrated circuit dies in accordance with the present invention.

Figure 1:
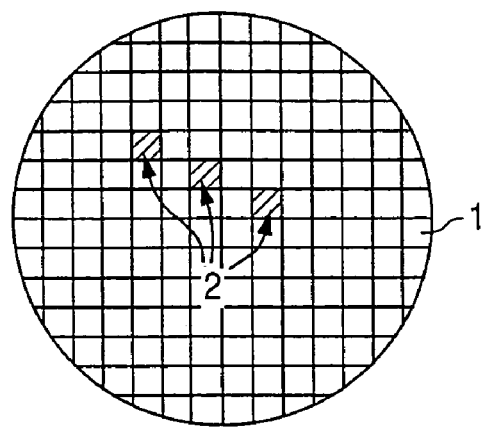
FIG. 1 is a plan view illustrating a semiconductor wafer having semiconductor IC die formed therein in the conventional manner.

Manufacture of the wafer scale structure begins with a semiconductor wafer 1 as shown in FIG. 1. On the semiconductor wafer 1 are formed a number of individual semiconductor integrated circuit die 2. The principle of the present invention can be applied to any size semiconductor wafer, including 4-inch wafers, 6-inch wafers, 8-inch wafers and (when they become available) 12-inch wafers. Further, the invention is scalable beyond 12 inches and into any size wafer that can be created. The semiconductor wafer 1 can be created from any well-known semiconductor material including silicon, gallium arsenate and sapphire, although one of ordinary skill in the art will appreciate that any semiconductor material can be used.

Figure 2:
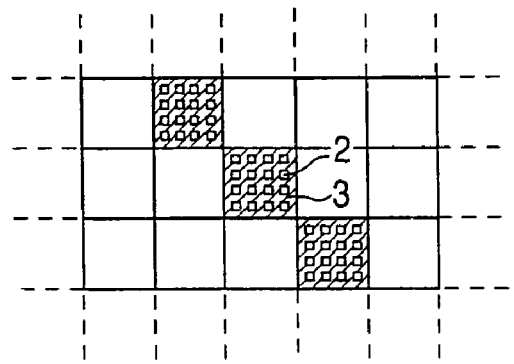
FIG. 2 is a plan view illustrating individual die formed on a wafer and bond pads formed on each individual die in the conventional manner.

FIG. 2 shows a close up view of individual integrated circuit die 2 disposed on the semiconductor wafer 1. Each individual die 2 has a number of bond pads 3 formed on its exposed upper surface. The bond pads 3 are created utilizing standard semiconductor process techniques.

Today's advanced microprocessors, memory chips and other advanced semiconductor circuitry require a great number of connections to other circuitry as well as to power and ground. These connections require a large number of bond pads. As discussed above, in most conventional semiconductor IC packaging techniques, the bond pads are located around the outside perimeter of the semiconductor die. Thus, the semiconductor die can be required to be a size that is larger than the circuitry on the die requires. The present invention allows the bond pads to be located throughout the entire semiconductor die area, thus avoiding the situation where the size of the semiconductor die is "pad limited".

Figure 3:
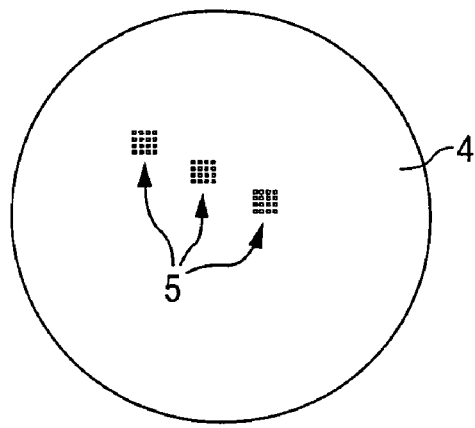
FIG. 3 is a plan view illustrating a glass sheet and groupings of holes created in the glass sheet for associated individual semiconductor die, in accordance with the present invention.

FIG. 3 shows a plan view of a unitary glass sheet 4 with groupings 5 of pre-formed holes in the glass sheet 4. The pre-formed holes 6 match the locations of the bond pads 3 on each individual semiconductor die 2 that is formed on the semiconductor wafer 1. The glass sheet 4 is substantially the same size as the semiconductor wafer 1 to which it will be affixed. In the present embodiment, the glass sheet 4 is preferably a boro-silicate a45 type of glass; one of ordinary skill in the art will appreciate that other types of glass (e.g., soda lime glass and other borate compounds) can be used for the glass sheet 4.

One of the most important aspects of the material chosen to be used for the glass sheet 4 is that it have a coefficient of thermal expansion that is close to that of the underlying semiconductor wafer 1. Other factors that relate to the usefulness of a particular type of glass in the present invention are its strength as a dielectric and its chemical resistance.

Figure 4:
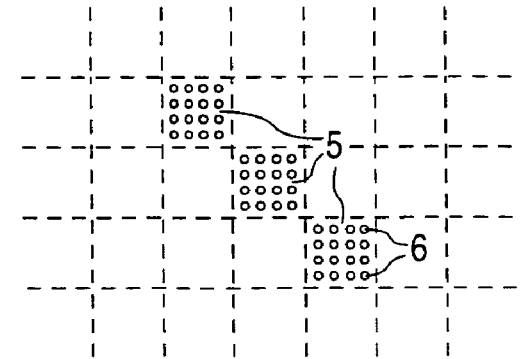
FIG. 4 is a plan view illustrating groupings of holes that match each individual semiconductor die on the semiconductor wafer and individual holes created in the glass sheet that match the location of bond pads on each individual semiconductor die, in accordance with the present invention.
Figure 5:
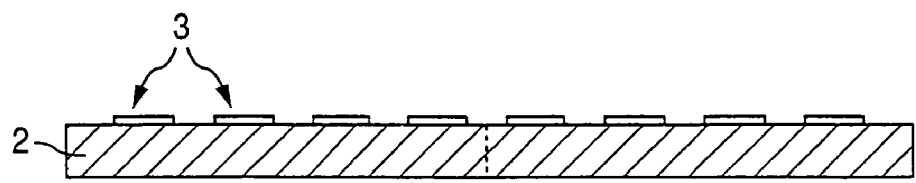
FIG. 5 is a side view illustrating the semiconductor wafer and the bond pads on the semiconductor die.
Figure 6:
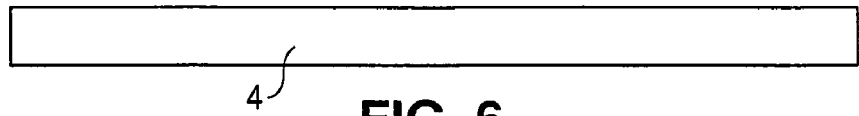
FIG. 6 is a side view illustrating the glass sheet.

FIG. 4 shows a closer view of the glass sheet 4 with the section of the glass sheet 4 for each individual semiconductor die 2 delineated by dotted lines. FIG. 4 also shows the individual groupings 5 of holes 6 in the glass sheet 4. FIG. 5 shows a side view of a semiconductor IC die 2 with bond pads 3. FIG. 6 shows a side view of the glass sheet 4.

Figure 7:
FIG. 7 is a side view illustrating holes created in the glass sheet and the tapered sides of each individual hole in the glass sheet.

FIG. 7 shows a side view of the glass sheet 4 with the individual preformed holes 6 cut in it. The preferred method to drill the holes 6 in the glass sheet 4 is by using a 150-watt carbon dioxide ($CO_2$) laser. For each hole 6 that is drilled, the glass 4 is exposed to the $CO_2$ laser for 3 milliseconds. The laser is held fixed above a pneumatic table that holds the glass sheet 4. The pneumatic table can adjust the location of the glass sheet 4 by using x and y coordinates. The location of each hole 6 on the glass sheet 4 is loaded into the computer-controlled pneumatic table in the form of software delineating the x and y coordinates of each hole 6 in the glass 4. To drill holes 6 in the glass 4, the glass sheet 4 is placed on the pneumatic table, coordinates are loaded into the table and the program runs that locates the glass sheet 4 under the laser for 3 milliseconds for each xy coordinate of holes 6 to be drilled in the glass 4. One of ordinary skill in the art should appreciate that while a 150 watt $CO_2$ high performance laser is a preferred laser to drill the holes 6, other types of lasers could be used (e.g., a KRF excimer laser).

Other means for drilling holes 6 in the glass sheet 4 are also available, e.g., a chemical etch process. This process is accomplished using standard semiconductor photolithography steps, the first of which is to apply a photoresist mask delineating on the glass sheet where the holes 6 should be located. The next step is to align the mask and then to expose it and develop it. The etch process is used to etch away the developed photoresist and expose the location for holes 6 in the glass 4. Finally, hydrofluoric acid or ammonium fluoride is applied to the glass 4 to etch the holes 6 in the glass 4.

The laser process is preferable to the chemical etch process because the chemical etch process is quite slow. One of ordinary skill in the art can appreciate that there are other ways to drill holes in the sheet of glass, such as using an ultrasonic beam.

FIG. 7 shows that pre-formed holes 6 drilled in the glass 4 preferably have tapered sidewalls 7. As discussed above, the holes 6 are drilled with a laser such that the top of the hole 6 is 4 mills and the bottom of the hole 6 is 2–3 mills so that the taper 7 has an included angle of 15–20%. This taper 7 allows the metal that is deposited through the hole 6 in the glass 4 to connect with the bond pad 3 on the semiconductor wafer 1 to attach more firmly to the glass 4.

Figure 8:
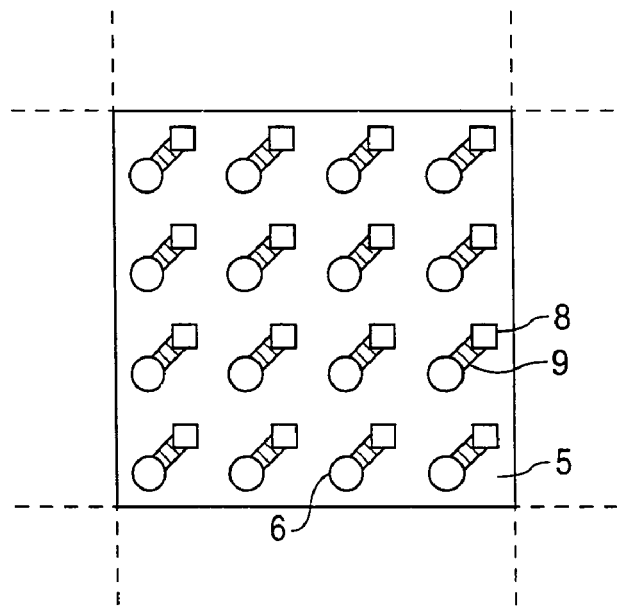
FIG. 8 is a plan view illustrating the glass sheet on the individual die level with the metallic pads and the traces that extend from the holes to the metallic pads, in accordance with the present invention.
Figure 9:
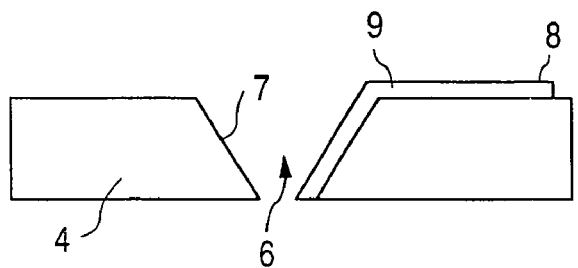
FIG. 9 is a partial cross-section view illustrating an individual hole cut in the glass sheet with tapering of the sides of the holes and the metallic trace that extends from the hole to the metallic pad, in accordance with the present invention.

The next step in the process is to deposit metallic traces on the surface of the glass sheet 4. FIG. 8 shows holes 6 in glass sheet 4 with metallic trace 9 and metallic pad 8 deposited on the glass 4. The first step in applying metallization to the surface of the glass sheet 4 is to deposit 500 angstroms of chrome on the glass sheet 4. The second step is to deposit 5,000 angstroms of nickel on the chrome. Chrome is the preferred metal to be deposited first because it adheres well to the glass sheet 4. Nickel is preferred for the second layer because it bonds well with the solder balls that are attached to the metallic pads 8 created from the nickel in a later step in this process. Both have excellent conductivity properties. Next, a layer of photoresist is applied on top of the layer of nickel. Standard semiconductor photolithography steps are then used to etch away portions of the metal that will create the metallic trace 9 and metallic pad 8 for each pre-formed hole 6. The first step of the photolithography process is to apply photoresist over the entire surface of the deposited chromium and nickel. A mask is used to selectively expose photoresist over the unwanted metal so that metallic pad 9 and metallic trace 8 are created adjacent to pre-formed hole 6. The exposed photoresist and the metal underneath the exposed photoresist are removed using a chemical etch process. The photoresist is developed in developer, and thus removes the exposed photoresist exposing the underlying metal traces. A 10% hydrogen chloride solution is used to remove the unwanted metal. After this etching step, metallic pad 8 and metallic trays 9 are left connected to hole 6. After the final etch process, a plasma ash process is used to clean the entire glass sheet 4, including undeveloped photoresist from the top of the remaining metal layers. After the final step in the application of the first layer of metal on the glass sheet 4 what remains is shown in FIG. 9. FIG. 9 shows the glass sheet after the final metal process.

The next step in the process is to adhere the glass sheet 4 to the semiconductor wafer 1. The first step in this process module is to apply a layer of adhesive 10 to the semiconductor wafer 1. The preferred adhesive material 10 is epotech 314. This adhesive is chosen because it is optically clear and has a high temperature range. While epotech 314 is the preferred adhesive 10 for the present invention, one of ordinary skill in the art can appreciate that other well-known adhesives will accomplish the same goals.

In the preferred embodiments disclosed in this application, one gram of epotech 314 adhesive is deposited in the center of a 4-inch wafer and then spun at 1,000–2,000 RPM for 5–10 seconds to spread the adhesive material evenly over the wafer 1. After the adhesive 10 is spun onto the wafer 4, the glass sheet 4 is optically aligned to the wafer 1 and placed onto the wafer 1 itself. The wafer-adhesive-glass sheet sandwich is then placed in a vacuum chamber to remove the air from between the glass sheet 4 and the wafer 1. After the vacuum is applied to remove the air, the adhesive 10 is partially cured for 5 minutes at 150° C.

Figure 10:
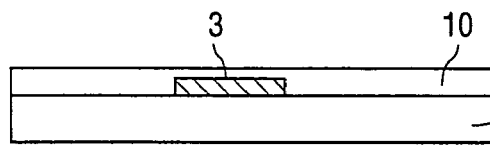
FIG. 10 is a partial cross-section view illustrating the adhesive layer deposited on top of the semiconductor wafer and the bond pad.
Figure 11:
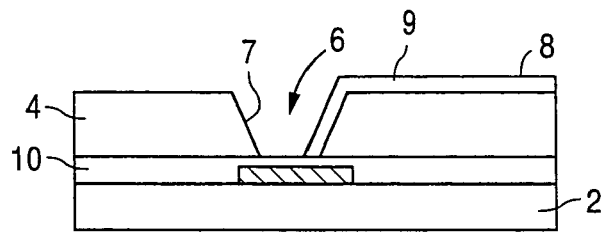
FIG. 11 is a partial cross-section view illustrating the glass sheet adhered with adhesive to semiconductor wafer.
Figure 12:
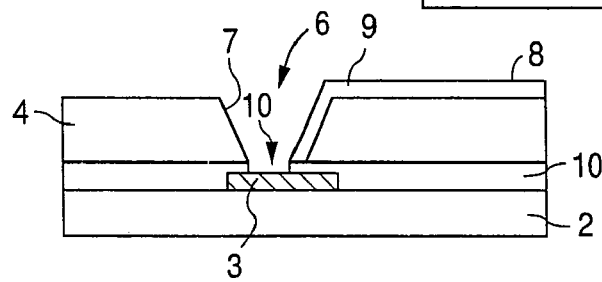
FIG. 12 is a partial cross-section view illustrating the glass sheet adhered to the semiconductor wafer with adhesive after the adhesive has been etched out of the hole in the glass sheet.

FIG. 10 shows layer of adhesive 10 applied to the top of the semiconductor die 2 on top of bond pad 3. FIG. 11 shows glass sheet 4 attached with adhesive 10 to semiconductor die 2. The next step in the process is to plasma ash the sandwich to remove the adhesive 10 above bond pad 3. FIG. 12 shows glass sheet 4 attached with adhesive 10 to semiconductor die 2. Pre-formed hole 6 is aligned above bond pad 3 and the adhesive 10 has been removed to expose the bond pad 3. After the plasma ash step, the adhesive 10 is cured completely for 55 minutes at 150° C.

The next step in the process is to electrically connect the metallic pads 8 that are connected to metallic traces 9 to the bond pads 3 on the surface of the semiconductor die 2. This is accomplished by depositing a layer of metal through the hole 6 in the glass sheet 4 that electrically connects metallic trace 9 to bond pad 3.

Figure 13:
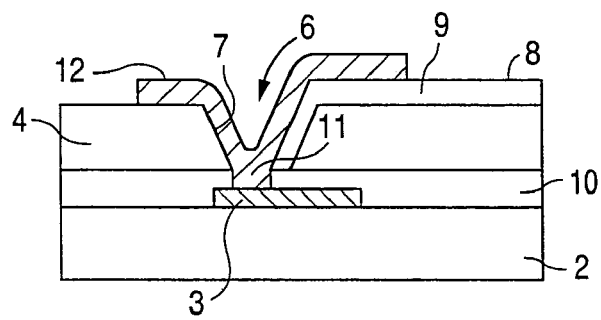
FIG. 13 is a partial cross-section view illustrating the second layer of metal deposited into the hole in the sheet of glass to create an electrical connection between the bond pad and the metallic trace that extends from the hole to the metallic pad on the glass sheet.
Figure 14:
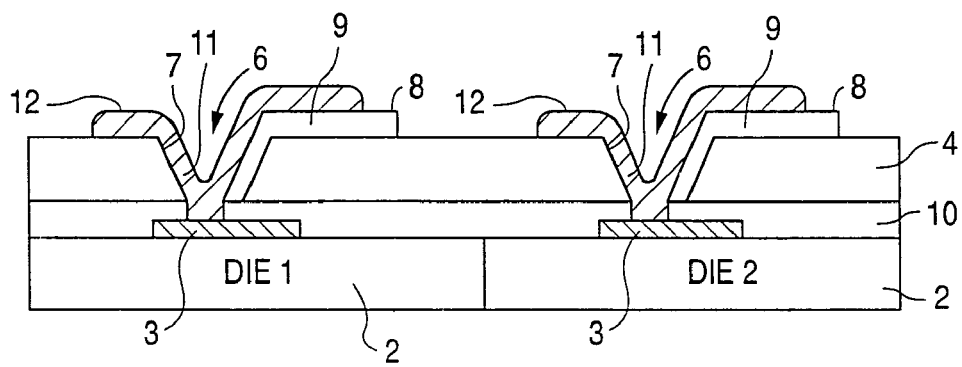
FIG. 14 is a partial cross-section view illustrating a side view of two individual die with bond pads electrically connected by a second layer of metal to the conductive trace and metallic pad, in accordance with the present invention.

FIG. 13 shows a metal layer 12 deposited in hole 6 such that it electrically connects bond pad 3 to metallic trace 9. The first step to create new metal through hole 6 connecting bond pad 3 to metallic trace 9 is to apply a photoresist mask to the surface of the glass sheet 4 attached to the wafer 1. The areas requiring metallization are formed after the photoresist is applied to the top of the glass sheet 4, a mask is applied to the areas that will have aluminum deposited on them, the mask is exposed and developed using standard photolithography techniques. The next step is to plasma ash the glass sheet/wafer sandwich to expose the holes 6, the bond pads 3 and the metallic traces 9. The next step is to reverse sputter to clean the aluminum oxide from pads 3 on the die 2 and the traces 9 on the glass sheet 4. Using standard semiconductor sputtering processes, 5,000 angstroms of aluminum are sputtered onto the top of the glass sheet 4. After sputtering the aluminum, the remaining photoresist and excess aluminum is removed with a standard semiconductor plasma etch process.

Figure 15:
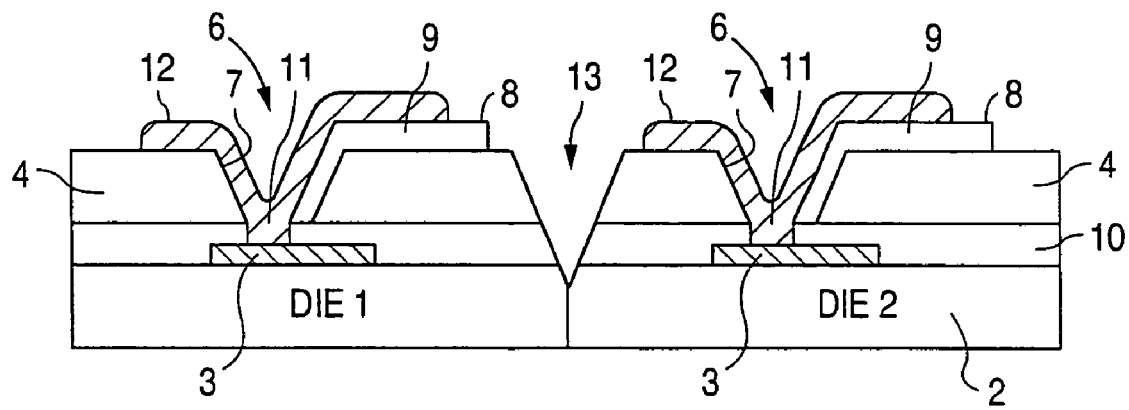
FIG. 15 is a partial cross-section view illustrating two individual semiconductor die with glass sheet attached and with a trench cut through the glass sheet and the adhesive and into the semiconductor die, in accordance with the present invention.
Figure 16:
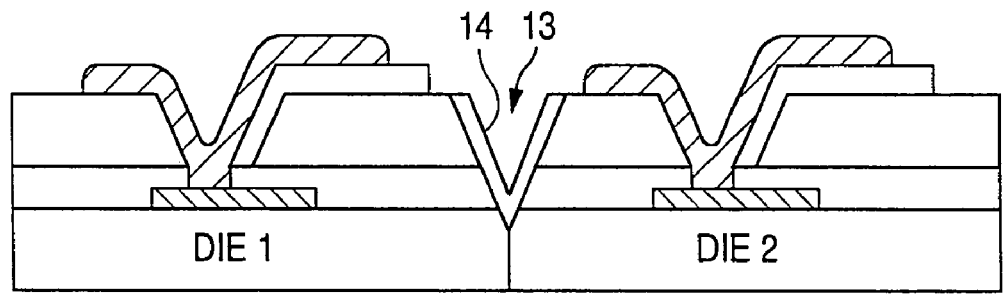
FIG. 16 is a partial cross-section view illustrating the trench between the semiconductor die with noble metal deposited on the sides of the trench and extending over the glass sheet and the adhesive and into the semiconductor material, in accordance with the present invention.

The next step is to cut the matrix of trenches around each individual semiconductor die. FIG. 15 shows two individual semiconductor die 2 and trench 13 cut between them. Trench 13 is cut using standard semiconductor scribing processes and a standard V-shaped diamond saw. The trench is cut at a 10–20° angle from perpendicular to the semiconductor wafer 1. A 10% margin of error is allowed. A trench 13 is cut around the perimeter of each individual semiconductor die 2 such that there are four trenches—one on each side of the die 2. The trenches 13 are cut to extend through the glass sheet 4, the adhesive 10 and into the semiconductor wafer material 1. After the trench 13 is cut, a layer of noble metal 12 is formed on the sidewalls of the trench 13 such that the metal 14 covers the interface between the glass sheet 4, the adhesive 10 and the semiconductor die 2, as shown in FIG. 16. This layer is formed using standard semiconductor lift-off processing for metallization. Metal deposition uses one of several standard semiconductor methodologies; such as sputtering or evaporation. After lift-off of the metal on the unwanted areas, the sides of the V-trench have a solid coating of metal from the glass on top to the wafer bulk material below and covering all of the exposed epoxy.

Figure 17:
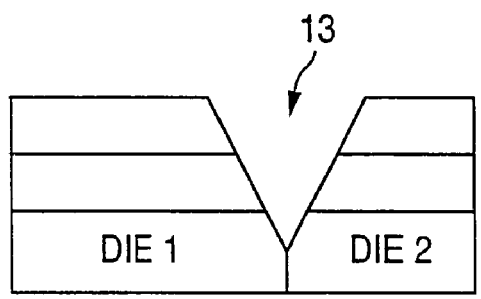
FIG. 17 is a partial cross-section view illustrating the trench cut between two semiconductor die.

FIG. 17 shows a close up view of trench 13 cut along the periphery of die number 1 and die number 2.

Figure 18:
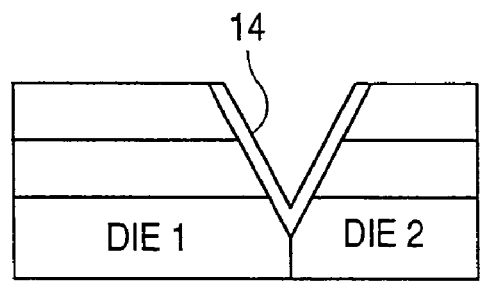
FIG. 18 is a partial cross-section view illustrating the trench cut between two semiconductor die with noble metal deposited on the sides of the trench.

FIG. 18 shows the trench 13 with the deposited noble metal 14 covering the interface between the glass 4, the adhesive 10 and the semiconductor wafer 1.

Figure 19:
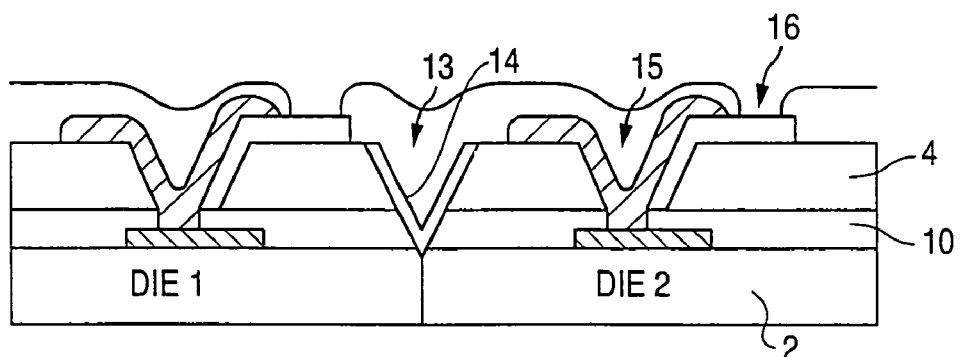
FIG. 19. is a partial cross-section view illustrating two semiconductor die with the trench cut between them and noble metal deposited in the trench with a protective mask deposited over the entire structure and a metallic pad uncovered such that a solder ball can be deposited on the metallic pad, in accordance with the present invention.
Figure 20:
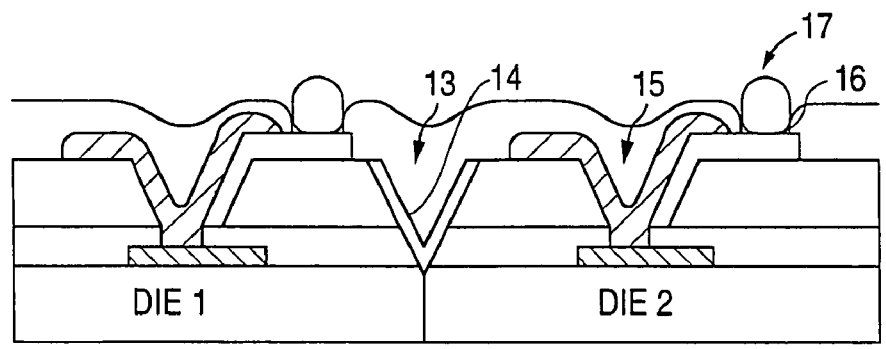
FIG. 20 is a partial cross-section view illustrating two semiconductor die with a solder ball deposited on top of the metallic pad.
Figure 21:
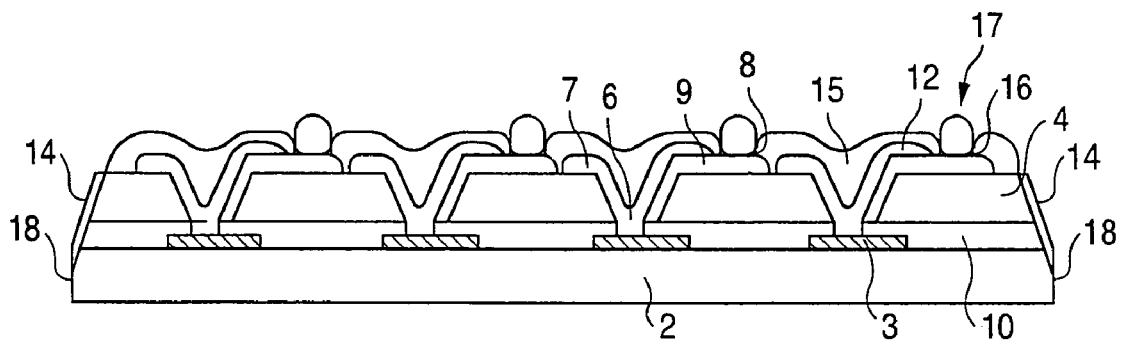
FIG. 21 is a partial cross-section view illustrating a completed individually packaged, hermetically sealed die in accordance with the present invention.

After the trench 13 is cut, the next step is to deposit a layer of photoresist 15 as shown in FIG. 19 over the entire wafer structure. Then the areas over the metallic pads 8 where the solder balls are attached are masked, the liquid photoresist is exposed and developed and the areas above the metallic pads 8 are stripped using a standard plasma etch process. The areas above the metallic pads 8 are then exposed to a plasma ash process where they are cleaned. Next, as shown in FIG. 20, solder ball 17 is formed on top of metallic pad 8. The solder ball 17 is reflowed and is then attached to metallic pad 8.

Figure 22:
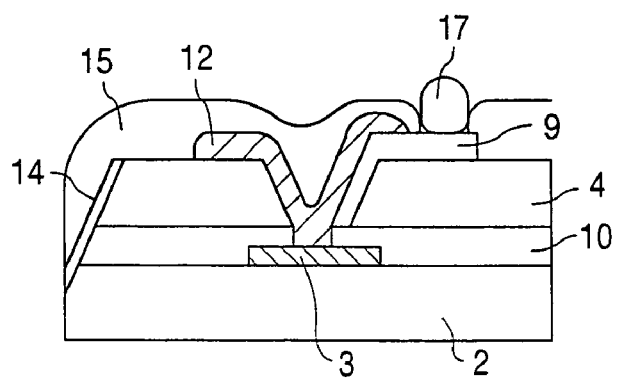
FIG. 22 is a partial cross-section view illustrating a finished chip scale package in accordance with the present invention.

The final step of the process is to dice the individual semiconductor die 2 into individual hermetically packaged semiconductor die. Using standard semiconductor dicing process technology, a wafer saw cuts through the wafer bulk material from the bottom of the V-trench to the back side of the wafer. This leaves a finished chip-scale-package with a glass top 4, tapered sides at the top edge which are coated with metal 14 and straight wall bulk material 2 below the taper, as shown in FIG. 22.

What is claimed is:

1. A method of fabricating a wafer scale semiconductor integrated circuit structure, the method comprising:
    forming holes in a solid glass sheet, wherein the holes correspond to the location of bond pads disposed on the surface of a semiconductor substrate, the semiconductor substrate having a plurality of individual semiconductor integrated circuit die disposed therein;
    depositing a first layer of conductive material on the surface of the solid glass sheet;
    etching the conductive material to create a pattern of traces for electrically connecting said holes to conductive pads on the solid glass sheet;
    depositing adhesive on the surface of the semiconductor substrate;
    forming a trench around each semiconductor integrated circuit die on the semiconductor substrate;
    depositing hermetic material in the trench cut around each of the semiconductor integrated circuit die;
    affixing the glass sheet to the semiconductor substrate such that the holes in the solid glass sheet are aligned to match the location of the bond pads on the semiconductor substrate and such that the trench around each semiconductor die in combination with the material deposited in the trench forms a hermetic seal between the solid glass sheet and the semiconductor substrate;
    depositing a second layer of conductive material on the surface of the solid glass sheet, wherein the second layer of conductive material electrically connects the bond pads on the semiconductor substrate to the conductive material traces on the surface of the solid glass sheet.

2. A method as in claim 1, and wherein the semiconductor substrate is silicon.

3. A method as in claim 2, and wherein the second layer of conductive material is a metal selected from the group consisting of aluminum, nickel, gold, copper, and chromium.

4. A method as in claim 1, and wherein the holes in the solid glass sheet are drilled with a laser.

5. A method as in claim 1, and wherein the holes in the solid glass sheet are created by etching the glass.

6. A method as in claim 1, and wherein the holes in the solid glass sheet are tapered.

7. A method as in claim 1, and wherein the solid glass sheet has a coefficient of thermal expansion that is substantially the same as the coefficient of thermal expansion of the semiconductor substrate.

8. A method as in claim 1, and wherein the solid glass sheet comprises bora-silicate glass A45.

9. A method as in claim 1, and wherein the first layer of conductive material is a metal selected from the group consisting of aluminum, nickel, gold, copper, or chromium.

10. A method as in claim 1, and wherein the first layer of conductive material comprises chromium and nickel.

11. A method as in claim 1, and wherein the adhesive material is optically clear.

12. A method as in claim 1, and wherein the trench around the perimeter of the semiconductor die is cut with a V-shaped diamond saw.

13. A method as in claim 1, and wherein the hermetic material deposited in the trench around the perimeter of the semiconductor die is selected from the group consisting of aluminum, nickel, gold, copper and chromium and combinations thereof.

14. A method of fabricating a wafer scale semiconductor integrated circuit structure, the method comprising the steps of:
    forming holes in a solid glass sheet, wherein the holes correspond to the location of bond pads disposed on the surface of a semiconductor substrate, the semiconductor substrate having at least one individual semiconductor die disposed therein;
    depositing a first layer of conductive material on the surface of the solid glass sheet;
    etching the conductive material to create a pattern of traces for electrically connecting said holes to conductive pads on the solid glass sheet;
    depositing adhesive on the surface of the semiconductor substrate;
    forming a trench around each semiconductor die on the semiconductor substrate;
    depositing hermetic material in the trench cut around each of the semiconductor die;
    affixing the solid glass sheet to the semiconductor substrate, wherein the holes in the solid glass sheet are aligned to match the location of the bond pads on the semiconductor substrate and the trench around each semiconductor die in combination with the material deposited in the trench forms a hermetic seal between the solid glass sheet and the individual semiconductor die;
    forming a second layer of patterned conductive material on the surface of the solid glass sheet, wherein the second layer of conductive material electrically connects the bond pads on the semiconductor substrate to the first layer of conductive material traces on the surface of the solid glass sheet through the holes in the solid glass sheet; and
    attaching solder balls to the surface of the glass sheet, wherein the solder balls are attached such that they are electrically connected to the bond pads on the semiconductor substrate.

15. A method as in claim 14, and further comprising the step of cutting the semiconductor substrate with said affixed solid glass sheet into at least one individual semiconductor die.

16. A method as in claim 14, and wherein the semiconductor substrate comprises silicon.

17. A method as in claim 14, and wherein the holes in the solid glass sheet are drilled with a laser.

18. A method as in claim 14, and wherein the holes in the solid glass sheet are formed by etching the glass.

19. A method as in claim 14, wherein the holes in the solid glass sheet are tapered.

20. A method as in claim 14, and wherein the solid glass sheet has a coefficient of thermal expansion that is substantially the same as the coefficient of thermal expansion of the semiconductor substrate.

21. A method as in claim 14, and wherein the solid glass sheet comprises bora-silicate glass A45.

22. A method as in claim 14, and wherein the first layer of conductive material is a metal selected from the group consisting of aluminum, nickel, gold, copper, and chromium.

23. A method as in claim 14, and wherein the first layer of conductive material comprises chromium and nickel.

24. A method as in claim 14, and wherein the adhesive material is optically clear.

25. A method as in claim 14, and wherein the trench around the perimeter of the semiconductor substrate is cut with a V-shaped diamond saw.

26. A method as in claim 14, and wherein the material deposited in the trench around the perimeter of the semiconductor substrate is selected from the group consisting of aluminum, nickel, gold, copper and chromium and combinations thereof.

27. A method as in claim 14, and wherein the second layer of conductive material is a metal selected from the group consisting of aluminum, nickel, gold, copper, or chromium.

28. A method of forming a wafer scale semiconductor integrated circuit structure, the method comprising:
    providing a semiconductor wafer that is subdivided into a plurality of integrated circuit die regions, each integrated circuit die region including an integrated circuit structure that is formed on an upper surface of the semiconductor wafer and that includes a plurality of spaced-apart conductive die bond pads arranged in a pattern;
    providing a unitary, substantially planar solid glass sheet having substantially the same size as the semiconductor wafer and having a plurality of prefabricated holes formed therethrough from an upper surface of the solid glass sheet to a lower surface of the solid glass sheet, the prefabricated holes being formed to provide a plurality of hole patterns, each hole pattern corresponding to a pattern of die bond pads formed in a corresponding integrated circuit die region of the semiconductor wafer, each prefabricated hole formed in the solid glass sheet having an associated conductive bond pad formed on the upper surface of the solid glass sheet;
    utilizing adhesive material disposed between the upper surface of the semiconductor wafer and the lower surface of the solid glass sheet to affix the solid glass sheet to the semiconductor wafer such that each hole pattern in the solid glass sheet is associated with a corresponding pattern of die bond pads;
    for each conductive bond pad formed on the upper surface of the solid glass sheet, forming conductive material in electrical contact with said conductive bond pad and extended through the associated hole in the solid glass sheet and into electrical contact with the associated die bond pad;
    forming a trench matrix through the solid glass sheet, the adhesive material and into the upper surface of semiconductor wafer to extend around the perimeter of each integrated circuit die region; and
    depositing hermetic material in the trench matrix to form a hermetic seal over the interface between the solid glass sheet, the adhesive material and each integrated circuit die region.

29. A method as in claim 28, and wherein the semiconductor wafer comprises silicon.

30. A method as in claim 28, and wherein the glass sheet has a coefficient of thermal expansion that is substantially the same as the coefficient of thermal expansion of the semiconductor wafer.

31. A method as in claim 28, and wherein the solid glass sheet comprises boro-silicate glass.

32. A method as in claim 28, and wherein each conductive bond pad formed on the upper surface of the solid glass sheet comprises a conductive pad formed adjacent to the associated hole in the solid glass sheet and a conductive trace that is electrically connected to the conductive pad and extends into the associated hole in the glass sheet.

33. A method as in claim 32, and wherein the conductive material formed in electrical contact with the conductive bond pad comprises a layer of patterned conductive material that extend through the holes in the solid glass sheet to electrically connect each of the conductive traces that extend into holes with an associated die bond pad.

34. A method as in claim 33, and further comprising, for each conductive pad, a solder ball formed on the conductive pad such that an electrical connection is made between the solder ball and the associated die bond pad.

35. A method as in claim 28, and wherein the semiconductor wafer is disposed to be divided into at least one individual packaged semiconductor die.

36. A method as in claim 28, and wherein the semiconductor wafer is subdivided into a plurality of individual packaged semiconductor die by cutting the semiconductor wafer.

37. A method as in claim 28, and wherein the hermetic material comprises a noble metal.

* * * * *